(12) United States Patent
Wielage et al.

(10) Patent No.: US 12,346,696 B2
(45) Date of Patent: Jul. 1, 2025

(54) SYSTEM AND METHOD OF DIGITAL TO ANALOG CONVERSION USING DYNAMIC ELEMENT MATCHING

(71) Applicant: NXP B.V., Eindhoven (NL)

(72) Inventors: Paul Wielage, Waalre (NL); Ayoub Rifai, Toulouse (FR); Dominique Delbecq, Fonsorbes (FR)

(73) Assignee: NXP B.V., Eindhoven (NL)

( * ) Notice: Subject to any disclaimer, the term of this patent is extended or adjusted under 35 U.S.C. 154(b) by 46 days.

(21) Appl. No.: 18/483,064

(22) Filed: Oct. 9, 2023

(65) Prior Publication Data
US 2024/0134647 A1   Apr. 25, 2024

(30) Foreign Application Priority Data
Oct. 14, 2022   (EP) .................................... 22306558

(51) Int. Cl.
| | |
|---|---|
| *G06F 9/30* | (2018.01) |
| *H03M 1/06* | (2006.01) |
| *H03M 1/60* | (2006.01) |
| *H03M 1/66* | (2006.01) |

(52) U.S. Cl.
CPC ...... *G06F 9/30145* (2013.01); *G06F 9/30032* (2013.01); *G06F 9/30098* (2013.01); *H03M 1/066* (2013.01); *H03M 1/66* (2013.01)

(58) Field of Classification Search
None
See application file for complete search history.

(56) References Cited

U.S. PATENT DOCUMENTS

| | | | | |
|---|---|---|---|---|
| 5,084,701 A | * | 1/1992 | Sauerwald .......... | H03M 1/0665 341/118 |
| 5,221,926 A | * | 6/1993 | Jackson .............. | H03M 1/0665 341/120 |
| 5,684,482 A | * | 11/1997 | Galton ................ | H03M 1/0668 341/144 |

(Continued)

OTHER PUBLICATIONS

'Full-custom design of split-set data weighted averaging with output register for jitter suppression' by Jubay et al., IOP Conf. Series: Materials Science and Engineering 79 (2015). (Year: 2015).*

(Continued)

*Primary Examiner* — Steven G Snyder (57) ABSTRACT

A dynamic element matching system including sequential register groups, decode circuitry, and pointer control circuitry. Each register group includes at least two registers. The decode circuitry controls a state of each register group based on a level of a digital input signal, a relative position with respect to a begin pointer and an end pointer, and a corresponding one of multiple pseudo random probability values. The pointer control circuitry cyclically advances the end pointer among the register groups causing decode circuitry to add one or more register groups and enable a register within each added register group in response to the level of the digital input signal increasing, and also cyclically advances the begin pointer among the register groups causing the decode circuitry to remove one or more register groups and disable a register within each removed register group in response to the level of the digital input signal decreasing.

17 Claims, 8 Drawing Sheets

(56) References Cited

U.S. PATENT DOCUMENTS

| | | | | |
|---|---|---|---|---|
| 7,119,725 | B1* | 10/2006 | Shih | H03M 1/0665 341/143 |
| 7,123,178 | B2* | 10/2006 | Ishizuka | H03M 1/067 341/143 |
| 7,183,955 | B1* | 2/2007 | Shih | H03M 1/0665 341/143 |
| 7,868,807 | B2* | 1/2011 | Liu | H03M 1/0665 341/143 |
| 8,427,351 | B2* | 4/2013 | Chou | H03M 1/0624 341/144 |
| 8,736,476 | B2* | 5/2014 | Gong | H03M 1/0673 341/145 |
| 11,799,490 | B2 | 10/2023 | Lin | H03M 1/067 |
| 2006/0007027 | A1* | 1/2006 | Ishizuka | H03M 1/067 341/50 |
| 2009/0040087 | A1* | 2/2009 | Liu | H03M 1/0665 341/144 |
| 2014/0118172 | A1* | 5/2014 | Gong | H03M 1/0673 341/144 |
| 2021/0110852 | A1* | 4/2021 | Bal | H03L 7/1075 |
| 2023/0024276 | A1* | 1/2023 | Lin | H03M 3/468 |

OTHER PUBLICATIONS

'Reducing multibit DAC circuits errors by a simplified dynamic element matching algorithm used in delta-sigma converters' by Esmaeil Najafi Aghdam et al., 15th ICEE, Iran 2007. (Year: 2007).*

Aghdam, E., "Novel dynamic element matching techniques for multibit DAC used in a delta-sigma modulator", HAL Open Science, pp. 1-238, (English Title and Summary downloaded from the internet Aug. 8, 2023), Jun. 30, 2006.

Chan, K., "Dynamic Element Matching to Prevent Nonlinear Distortion From Pulse-Shape Mismatches in High-Resolution DACs", IEEE Journal of Solid-State Circuits, vol. 43, No. 9, Sep. 2008.

Galton, I., "Spectral Shaping of Circuit Errors in Digital-to-Analog Converters", IEEE Transactions on Circuits and Systems—II: Analog and Digital Signal Processing, vol. 44, No. 10, Oct. 1997.

Kong, D., "A 600-MS/s DAC With Over 87-dB and 77-dB Peak SNDR Enabled by Adaptive Cancellation of Static and Dynamic Mismatch Error", IEEE Journal of Solid-State Circuits, vol. 54, No. 8, Aug. 2019.

Lin, H., "Multi-Bit DAC with Noise-Shaped Element Mismatch", 1996 IEEE International Symposium on Circuits and Systems (ISCAS), May 15, 1996.

Sanyal, A., "A Thermometer-Like Mismatch Shaping Technique With Minimum Element Transition Activity for Multibit $\Delta\Sigma$ DACs", IEEE Transactions on Circuits and Systems—II: Express Briefs, vol. 61, No. 7, Jul. 2014.

Schreier, R., "Noise-shaped multbit D/A convertor employing unit elements", IET Digital Library, Electronics Letters, vol. 31, No. 20, Sep. 28, 1995.

Shen, M., "Random Swapping Dynamic Element Matching Technique for Glitch Energy Minimization in Current-Steering Dac", IEEE Transactions on Circuits and Systems—II: Express Briefs, vol. 57, No. 5, May.

Su, W., "A Novel Dynanmic Element Matching Technique in Current-Steering DAC", 2011 IEEE International Conference of Electron Devices and Solid-State Circuits, Nov. 17-18, 2011.

Sun, N., "Low-Complexity High-Order Vector-Based Mismatch Shaping in Multibit $\Delta\Sigma$ ADCs", IEEE Transactions on Circuits and Systems—II: Express Briefs, vol. 58, No. 12, Dec. 2011.

Wang, Y., "Thermo data-weighted average dynamic element matching (DEM) encoder for current-steering DACs", IEICE Electronics Express, vol. 10, No. 20, Jul. 11, 2013.

Andersson K. O. et al.: "Modeling of glitches due to rise/fall asymmetry in current-steering digital-to-analog converters," IEEE Trans. Circuits Syst. I, Reg. Papers, vol. 52, No. 11, pp. 2265-2275, Nov. 2005.

Baird R. T. et al.: "A low oversampling ratio 14-b 500-KHz /spl Delta//spl Sigma/ ADC with a self-calibrated multibit DAC" IEEE J. Solid-State Circuits, vol. 31, No. 3, pp. 312-320, Mar. 1996.

Baird R. T. et al.: "Linearity enhancement of multibit $\Delta\Sigma$ A/D and D/A converters using data weighted averaging," IEEE Trans. Circuits Syst. II, Analog Digit. Signal Process., vol. 42, No. 12, pp. 753-762, Dec. 1995.

De Bock M. et al.: "Calibration of DAC mismatch errors in $\Delta\Sigma$ ADCs based on a sine-wave measurement," IEEE Trans. Circuits Syst. II, Exp. Briefs, vol. 60, No. 9, pp. 567-571, Sep. 2013.

Nguyen K. et al.: "A 113 dB SNR oversampling Sigma-Delta DAC for CD/DVD application," IEEE Trans. Consum. Electron., vol. 44, No. 3, pp. 1019-1023, Aug. 1998.

Risbo L. et al.: "Digital approaches to ISI-mitigation in high-resolution oversampled multi-level D/A converters," IEEE J. Solid-State Circuits, vol. 46, No. 12, pp. 2892-2903, Dec. 2011.

Shui T. et al.: "Mismatch shaping for a currentmode multi-bit delta-sigma DAC," IEEE J. Solid-State Circuits, vol. 34, No. 3, pp. 331-338, Mar. 1999.

Sun N. : "High-order mismatch shaping in multi-bit $\Delta\Sigma$ DAC," IEEE Trans. Circuits Syst. II, Exp. Briefs, vol. 58, No. 6, pp. 346-350, Jun. 2011.

Sun N. : "High-Order Mismatch-Shaped Segmented Multibit DACs With Arbitrary Unit Weight," IEEE Trans. Circuits Syst. I, Reg. Papers, vol. 59, No. 2, pp. 295-304, Feb. 2012.

U.Moon et al.: "A switched-capacitor DAC with analog mismatch corrections," Electron. Lett., vol. 35, No. 22, pp. 1903-1904, Oct. 1999.

Van De Plassche R. J.: "Dynamic element matching for high accuracy monolithic D/A converters," IEEE J. Solid-State Circuits, vol. SC-11, No. 6, pp. 795-800, Dec. 1976.

* cited by examiner

A: (0% < S' < 50% & [BEGIN, END)) | S' = 50%
B: (0% < S' < 50% & [END, BEGIN)) | S' = 0%
C: (50% < S' < 100% & [BEGIN, END)) | S' = 100%
D: (50% < S' < 100% & [END, BEGIN)) | S' = 50%

SYSTEM AND METHOD OF DIGITAL TO ANALOG CONVERSION USING DYNAMIC ELEMENT MATCHING

CROSS-REFERENCE TO RELATED APPLICATIONS

This application claims the priority under 35 U.S.C. § 119 of application Ser. No. 22/306,558.2, filed on 14 Oct. 2022, the contents of which are incorporated by reference herein.

BACKGROUND

Field of the Invention

The present invention relates in general to a digital to analog conversion, and more particularly to a system and method of converting a digital signal to an analog signal using dynamic element matching to counteract mismatch errors that cause linearity degradations.

Description of the Related Art

A multi-bit digital-to-analog converter (DAC) driven by a thermometer decoder has excellent monotonous performance but suffers from non-linearities due to device mismatches and layout parasitics. In particular, the DAC suffers from device mismatches and non-linearities that arise from layout parasitics and process nonidealities, such as gradient errors and random etching effects. These mismatch errors cause severe linearity degradations in the conversion process. One known method to address this issue is calibration yet known analog or digital calibration schemes are generally complex, costly, and inconvenient.

SUMMARY

In accordance with a first aspect of the present disclosure, a dynamic element matching system is provided, comprising: a plurality of sequential register groups in which each register group comprises at least two registers; decode circuitry that controls a state of each of the plurality of register groups based on a level of a digital input signal, a relative position with respect to a begin pointer and an end pointer, and a corresponding one of a plurality of pseudo random probability values; and pointer control circuitry that cyclically advances the end pointer among the plurality of register groups to add one or more register groups and cause the decode circuitry to enable a register within each added register group in response to the level of the digital input signal increasing, and that cyclically advances the begin pointer among the plurality of register groups to remove one or more register groups and cause the decode circuitry to disable a register within each removed register group in response to the level of the digital input signal decreasing.

In one or more embodiments, the decode circuitry pseudo-randomly determines which register is enabled for each added register group having at least two disabled registers, and wherein the decode circuitry pseudo-randomly determines which register is disabled for each removed register group having at least two enabled registers.

In one or more embodiments, dynamic element matching system further comprises derivative control circuitry that generates a derivative signal indicative of a rate of change of the level of the digital input signal, and that generates a transition rate boost signal based on how much the derivative signal is below a predetermined minimum rate of change.

In one or more embodiments, the pointer control circuitry advances both the begin pointer and the end pointer by an amount proportional to the transition rate boost signal.

In one or more embodiments, the dynamic element matching system further comprises: shuffle control circuitry that throttles the transition rate boost signal based on the level of the digital input signal to provide a boost signal; and wherein the pointer control circuitry advances both the begin pointer and the end pointer by an amount proportional to the boost signal.

In one or more embodiments, the dynamic element matching system further comprises: shuffle control circuitry that uses the transition rate boost signal and the level of the digital input signal for determining a shuffle factor and that uses the shuffle factor to provide at least one shuffle value indicative of an amount of shuffling to apply; and wherein the decode circuitry uses the at least one shuffle value to pseudo-randomly shuffle enablement of registers in each register group having at least one and less than all registers enabled.

In one or more embodiments, the dynamic element matching system further comprises: shuffle control circuitry that determines a shuffle factor and that uses the shuffle factor to pseudo-randomly determine a plurality of shuffle values that are provided to the decode circuitry and distributed among the plurality of register groups; and wherein the decode circuitry uses the plurality of shuffle values to shuffle enablement of registers in each register group having at least one and less than all registers enabled.

In one or more embodiments, the dynamic element matching system further comprises: spread spectrum control circuitry that generates a boost signal having a value that is pseudo-randomly adjusted over time; and wherein the pointer control circuitry advances both the begin pointer and the end pointer by an amount proportional to the boost signal.

In accordance with a second aspect of the present disclosure, a digital to analog conversion system is provided, comprising: a digital to analog converter comprising a plurality of unitary conversion elements each activated by a corresponding one of a plurality of input bits; and dynamic element matching circuitry, comprising: a plurality of sequential register groups in which each register group comprises at least two registers and in which each register provides a corresponding one of the plurality of input bits to the digital to analog converter; decode circuitry that controls a state of each of the plurality of register groups based on a level of a digital input signal, a relative position with respect to a begin pointer and an end pointer, and a corresponding one of a plurality of pseudo random probability values; and pointer control circuitry that cyclically advances the end pointer among the plurality of register groups to add one or more register groups and cause the decode circuitry to enable a register within each added register group in response to the level of the digital input signal increasing, and that cyclically advances the begin pointer among the plurality of register groups to remove one or more register groups and cause the decode circuitry to disable a register within each removed register group in response to the level of the digital input signal decreasing.

In one or more embodiments, the decode circuitry pseudo-randomly determines which register is enabled for each added register group having at least two disabled registers, and wherein the decode circuitry pseudo-randomly determines which register is disabled for each removed register group having at least two enabled registers.

In one or more embodiments, the dynamic element matching circuitry further comprises derivative control circuitry that generates a derivative signal indicative of a rate of change of the level of the digital input signal, and that generates a transition rate boost signal based on an amount the derivative signal is below a predetermined minimum rate of change.

In one or more embodiments, the pointer control circuitry advances both the begin pointer and the end pointer by an amount proportional to the transition rate boost signal.

In one or more embodiments, the dynamic element matching circuitry further comprises: shuffle control circuitry that throttles the transition rate boost signal based on the level of the digital input signal to provide a boost signal; and wherein the pointer control circuitry advances both the begin pointer and the end pointer by an amount proportional to the boost signal.

In one or more embodiments, the dynamic element matching circuitry further comprises: shuffle control circuitry that determines a shuffle factor and that uses the shuffle factor to pseudo-randomly determine a plurality of shuffle values that are provided to the decode circuitry and distributed among the plurality of register groups; and wherein the decode circuitry uses the plurality of shuffle values to shuffle enablement of registers in each register group having at least one and less than all registers enabled.

In one or more embodiments, the dynamic element matching circuitry further comprises: spread spectrum control circuitry that generates a boost signal having a value that is pseudo-randomly adjusted over time; and wherein the pointer control circuitry advances both the begin pointer and the end pointer by an amount proportional to the boost signal.

In accordance with a third aspect of the present disclosure, a method of dynamic element matching is conceived, comprising: controlling a state of each of the plurality of register groups based on a level of a digital input signal, a relative position with respect to a begin pointer and an end pointer, and a corresponding one of a plurality of pseudo random probability values, wherein each of the plurality of register groups comprises at least two registers; cyclically advancing the end pointer among the plurality of register groups to add one or more register groups and enabling a register within each added register group in response to the level of the digital input signal increasing; and cyclically advancing the begin pointer among the plurality of register groups to remove one or more register groups and disabling a register within each removed register group in response to the level of the digital input signal decreasing.

In one or more embodiments, the method further comprises: pseudo-randomly determining which register is enabled for each added register group having at least two disabled registers; and pseudo-randomly determining which register is disabled for each removed register group having at least two enabled registers.

In one or more embodiments, the method further comprises: generating a derivative signal indicative of a rate of change of the level of the digital input signal; generating a transition rate boost signal based on an amount the derivative signal is below a predetermined minimum rate of change; and advancing both the begin pointer and the end pointer by an additional amount proportional to the transition rate boost signal.

In one or more embodiments, the method further comprises: generating a derivative signal indicative of a rate of change of the level of the digital input signal; generating a transition rate boost signal based on an amount the derivative signal is below a predetermined minimum rate of change; throttling the transition rate boost signal based on the level of the digital input signal and providing a boost signal; and advancing both the begin pointer and the end pointer by an additional amount proportional to the boost signal.

In one or more embodiments, the method further comprises: generating a spread spectrum control boost signal having a value that is pseudo-randomly adjusted over time; and advancing both the begin pointer and the end pointer by an additional amount proportional to the spread spectrum control boost signal.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

One method to overcome mismatch errors in digital to analog conversion is to use a dynamic element matching (DEM) technique. The DEM technique randomly scrambles the element selection, which effectively turns the mismatch-induced distortion into white noise. A system and method of dynamic element matching as described herein provides a low-cost solution for a DEM implementation based on pointers and randomized selection of unit DAC elements per groups of cells. Although a DEM encoder may provide much better linear performance, the cost can be significant when the number of elements of the DAC is high. A system and method of dynamic element matching as described herein offers good linear performance at low silicon cost for any size DAC.

In particular, DEM control simply advances two cyclic pointers among an array of output registers based on a level of the input signal. An end pointer is advanced to enable registers to activate corresponding DAC elements as the signal level increases, and a begin pointer is advanced to disable registers and deactivate corresponding DAC elements as the signal level decreases. An array of uniform DAC elements is selectively activated to contribute to the analog output. The registers and thus the pointers advance in register groups in which added or removed registers and corresponding DAC elements are pseudo-randomly enabled/activated or pseudo-randomly disabled/deactivated with each advance of the corresponding pointers. Derivative, shuffling, and spread spectrum control techniques are used to more evenly distribute utilization and transitioning of the DAC elements as compared to a conventional thermometer encoder. A derivative controller determines when changes of the signal level fall below a predetermined threshold for applying a boosting technique in which both pointers are artificially advanced by the same amount to more evenly distribute DAC element transitioning and utilization. A shuffle controller throttles boosting and increases shuffling when boosting is less effective, in which shuffling pseudo-randomly re-distributes enabled registers within register groups with at least one and less than all registers enabled. A spread spectrum controller artificially advances both pointers by a small and pseudo-randomly determined amount to reduce or otherwise minimize correlation between input signal tone(s) and the selected DAC elements.

Figure 1:
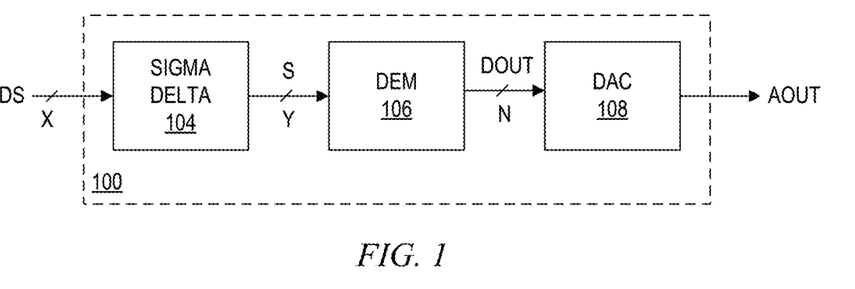
FIG. 1 is a simplified block diagram of a digital to analog conversion system including dynamic element matching (DEM) circuitry implemented according to one embodiment.

FIG. 1 is a simplified block diagram of a digital to analog conversion system 100 including dynamic element matching (DEM) circuitry 106 implemented according to one embodiment. DS is a digital input signal provided to an input of a sigma-delta converter 104. The DS signal may be a sinusoidal tone signal, such as a sine or cosine wave or the like, with specified parameters, such as frequency, amplitude, direct-current (DC) offset, and phase-offset. The sigma-delta converter 104 converts the DS signal, which is typically in the form of a high bit-count signal, into a lower bit-count, higher frequency digital signal S at its output. In general, the sigma-delta converter 104 pushes in-band quantization noise to higher frequencies (e.g., out-of-band) and allows for reduction of the bit-width of the signal that defines the output level of a digital to analog converter (DAC) 108. The S signal is provided to an input of the DEM circuitry 106, which converts the S signal into a digital output signal DOUT provided to an input of the DAC 108. The DAC 108 includes a set of unitary conversion elements (not shown), such as voltage elements or current elements, in which the outputs of activated ones of the unitary conversion elements are combined to develop an analog output signal AOUT. The unitary conversion elements of the DAC 108 are referred to herein as the DAC elements.

DS has X bits, S has Y bits, and DOUT has N bits, in which X, Y, and N are integer values. In one embodiment, DS may be a 16-bit signal (X=16) whereas S may be a 9-bit signal (Y=9). In one embodiment, the DAC 108 may include 256 DAC elements and DOUT may have N=256 bits for separately addressing each of the 256 DAC elements.

The DAC elements within the DAC 108 are intended to be the same size and substantially identical with each other so that each is intended to contribute the same unit voltage or the same unit current to the AOUT signal. Each bit of DOUT activates or deactivates a corresponding one of a set of voltage or current DAC elements, in which the output of each activated element is combined (e.g., added) together to develop AOUT. Although each of the set of DAC elements are intended to be identical, device mismatches, layout parasitics and process nonidealities, such as, for example, gradient errors and random etching effects, result in significant mismatch among the DAC elements. The mismatch error causes severe linearity degradations.

The DEM circuitry 106 performs a DEM technique to randomly scramble the element selection, which effectively turns the mismatch-induced distortion into white noise. The DEM circuitry 106 exploits the technique of random selection of the DAC elements over time such that the harmonics disappear and are converted into noise. As described further herein, the DEM circuitry 106 is low-cost and operates with low-latency. The DEM circuitry 106 realizes a trade-off between an amount of randomization and control activity level, resulting in an improved spurious-free dynamic range (SFDR) performance. In one embodiment, the sigma-delta converter 104 is used to improve the dynamic range of the DAC 108, which may be an 8-bit DAC (e.g., DAC 108) consisting of 256 DAC elements.

Figure 2:
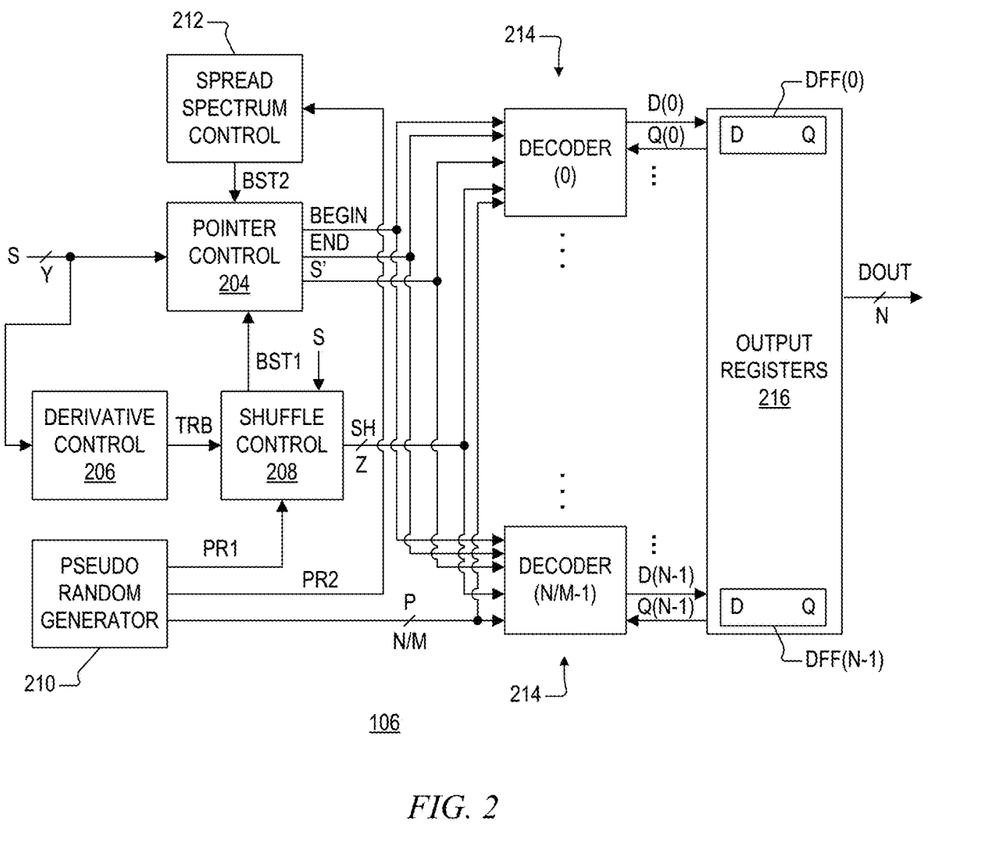
FIG. 2 is a simplified block diagram of the DEM circuitry of FIG. 1 implemented according to one embodiment with a register group size M.

FIG. 2 is a simplified block diagram of the DEM circuitry 106 implemented according to one embodiment with a register group size of M, in which M is an integer value of 1 or more. It is noted that M may be 1 but is usually at least 2 for improved performance. The digital output signal DOUT is an N-bit digital value that is a decoded version of the input S signal in the sense that the number of binary 1's in DOUT equals to the digital value of S. In one embodiment, N=256 for separately addressing the 256 different DAC elements of the DAC 108, although any number of bits is contemplated for different implementations. The S signal is provided to an input of pointer control circuitry 204, an input of derivative control circuitry 206, and an input of shuffle control circuitry 208. The derivative control circuitry 206 outputs a transition rate boost signal TRB which is provided to an input of shuffle control circuitry 208. The shuffle control circuitry 208 outputs a first boost adjust signal BST1 to another input of the pointer control circuitry 204, and also outputs a set of Z shuffle control signals SH. The pointer control circuitry 204 outputs a beginning index pointer BEGIN, an ending index pointer END, and a signal S' which is a delayed version of the S signal, such as after one clock cycle of an applicable clock signal (not shown). A clock signal is used, for example, to synchronize operation of each of the circuitry blocks. A pseudo random generator 210 outputs pseudo random signals PR1 and PR2, and a set of N/M pseudo-randomly determined binary probability values P. PR1 is provided to another input of the shuffle control circuitry 208. PR2 is provided to an input of spread spectrum control circuitry 212, which provides a second boost adjust signal BST2 to another input of the pointer control circuitry 204.

The BEGIN and END pointers, the S' signal, the SH signals, and the P values are provided to respective inputs of each of an array of N/M decoders 214, individually numbered 0 to N/M−1. The decoders 214 are also described herein as decode circuitry. Each of the N/M P values is provided to a corresponding one of the N/M decoders 214. Each of the decoders 214 controls the state of a corresponding one of N/M sequential register groups. Each register group includes M sequential registers from a set of N output registers 216 individually numbered 0 to N−1. Each register of the output registers 216 may be configured as a D-type flip-flop (DFF) having a D input and a Q output. In this manner, Q represents the current state of a DFF, and D represents the next state of that DFF. As shown, for example, the first decoder (0) receives an output signal Q(0) for determining the state of a first register DFF(0) of the first register group, and outputs a signal D(0) to control the next state of the first register DFF(0) of the first register group. Additional D and Q signals may be provided between the first decoder (0) and the output registers depending upon the value of M. For example, the first decoder (0) can receive an output signal Q(M−1) for determining the state of an Mth register DFF(M−1) of the first register group, and outputs a signal D(M−1) to control the next state of the Mth register DFF(M). This same pattern repeats up to the last decoder (N/M−1), which receives an output signal Q(N−1) for determining the state of a last register DFF(N−1) of the last register group, and outputs a signal D(N−1) to control the next state of the last register of the last register group. The set of N output registers 216 provides the N bits of DOUT for controlling the state (active or inactive) of the N DAC elements within the DAC 108.

Figure 10:
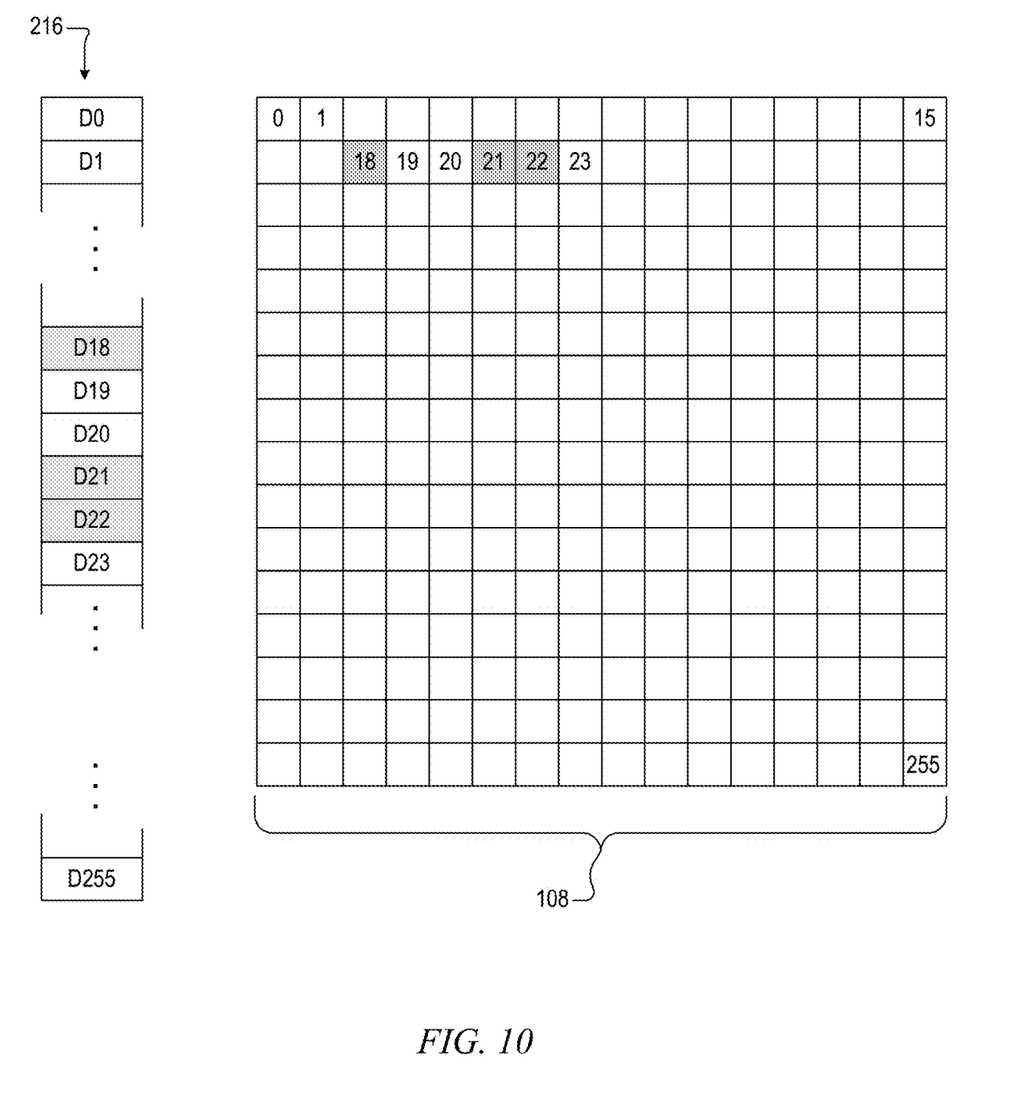
FIG. 10 is a simplified depiction of the set of N output registers of FIG. 2 providing the N bits of DOUT for controlling the state (active or inactive) of the N DAC elements within the DAC of FIG. 1 for the case in which N=256.

FIG. 10 is a simplified depiction of the set of N output registers 216 providing the N bits of DOUT for controlling the state (active or inactive) of the N DAC elements within the DAC 108 for the case in which N=256. The set of 256 registers 216 is depicted in simplified form as an array of 256 registers numbered D0 to D255 corresponding to the N=256 output bits of DOUT. Only a few are numbered, including registers for output bits D0, D1, . . . , D18, D19, D20, D21, D22, D23, . . . , D255 to illustrate the numbered positions of the registers. The DAC 108 for N=256 is depicted in simplified form as a 16×16 matrix of DAC elements numbered 0 to 255. Only a few are numbered, including 0, 1, . . . , 15, . . . , 18, 19, 20, 21, 22, 23, . . . , 255 to illustrate the numbered positions of the DAC elements. As shown, the registers for DOUT bits D18, D21, and D22 are shaded illustrating that only these registers are enabled. Thus, the DAC elements 18, 21, and 22 are shaded illustrating that only these DAC elements are activated based on enablement of the corresponding registers.

Figure 3:
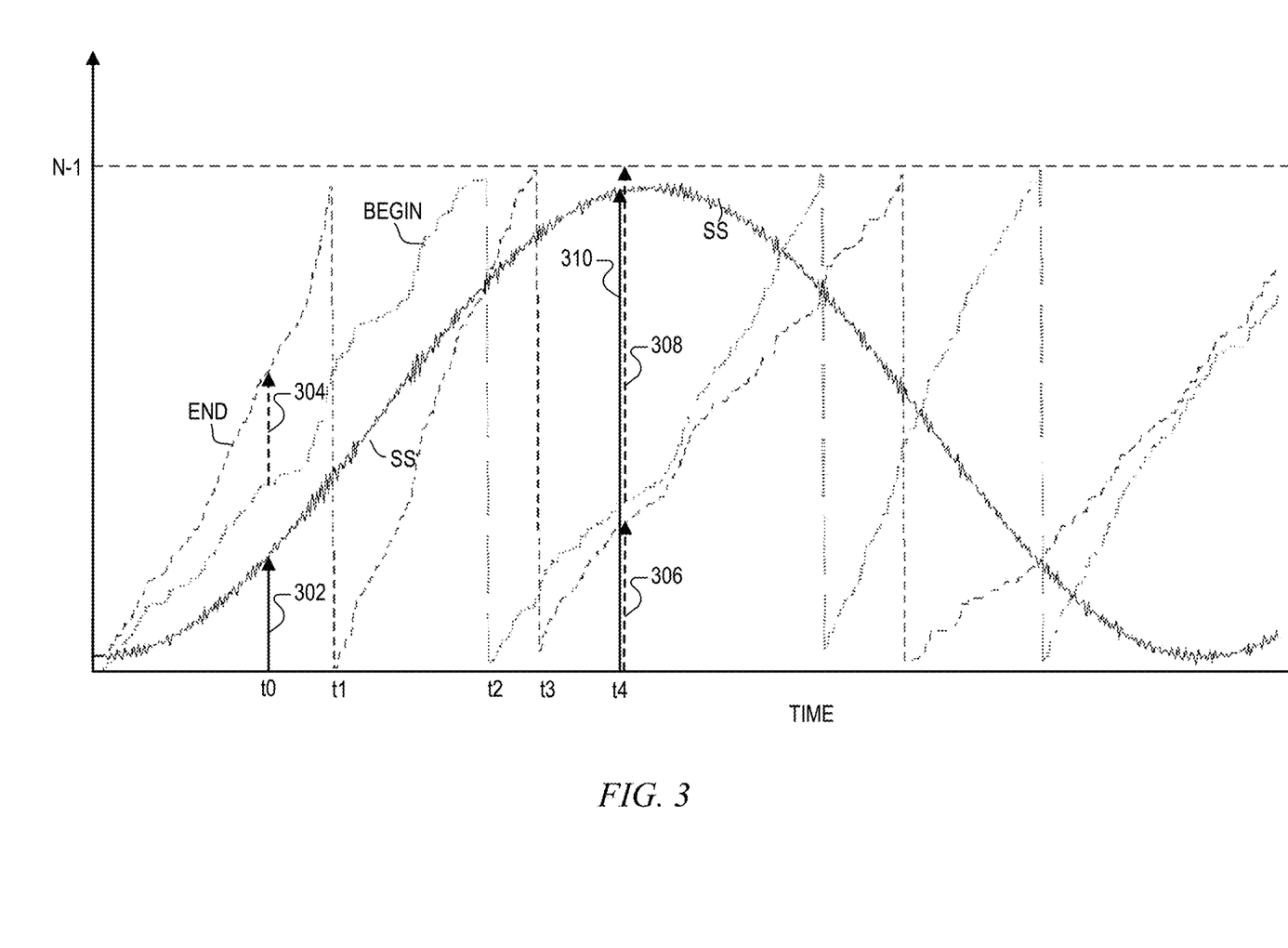
FIG. 3 is a graphic diagram plotting an exemplary signal S along with the index pointers BEGIN and END in digital units from 0 to N−1 versus time according to one embodiment with a group size of M=1.

FIG. 3 is a graphic diagram plotting an exemplary signal SS along with the index pointers BEGIN and END in digital units from 0 to N−1 versus time according to one embodiment with a group size of M=1. The unit of time is arbitrary depending upon the particular configuration. The SS signal shown in FIG. 3 is in the form of a noise-shaped sinusoidal waveform. The BEGIN and END pointers are cyclic pointers defining a range within an output register used to control the individual elements of the DAC 108. The registers in between the pointer values may be enabled (or "set") to activate corresponding DAC elements, whereas remaining registers outside the pointer range are disabled (or "cleared") to deactivate corresponding DAC elements. When more DAC elements are needed to be activated, the END pointer is advanced, and when less DAC elements are needed to be activated, the BEGIN pointer is advanced. The BEGIN and END pointers may be advanced by the same amount such that the same number of DAC elements are activated while the particular DAC elements are changed. For example, the BEGIN and END pointers may be advanced by the same amount to deactivate some DAC elements that were previously activated while activating the same number of additional DAC elements.

In general, the advancement of the BEGIN and END pointers is based on a group size, in which the group size may be 1 DAC element or more. In one embodiment, the DAC elements are divided in consecutive groups of "M" assuming that the total number N is divisible by M and that N≥M. The BEGIN and END pointers shown in FIG. 3 are implemented according to the simplest addressing scheme in case of M=1 for activating up to 256 DAC elements. The advancing of the pointers BEGIN, and END is depicted for the noise-shaped sine-wave signal SS. SS has a signal level that increases causing more DAC elements to be activated and that decreases causing less DAC elements to be activated over time. SS starts at a small DC offset in which BEGIN starts at zero and END is at a small offset so that a small number of DAC elements are activated based on the initial DC offset of SS. As SS increases with time, END advances to increase the number of activated DAC elements. Although a noiseless sine wave would initially only increase such that BEGIN would otherwise not advance in the simplest scheme illustrated, BEGIN advances when the added noise causes SS to intermittently decrease. At a time t0 while SS is still generally increasing, an arrow 302 depicts the signal level of SS, and a dashed arrow 304 depicts the activated DAC elements of the corresponding DAC, in which it is understood that the arrows 302 and 304 have the same size or length.

At a subsequent time t1 while SS is increasing, the pointer END cyclically wraps around to its modulo N value. It is noted that the END pointer may not necessarily reach the maximum value of N−1 before wrapping. Wrapping may occur before reaching N−1 depending upon the change of SS during the current clock period. After END wraps around, END is lower than BEGIN for a period of time from t1 to a subsequent time t2. At subsequent time t2, the pointer BEGIN wraps around and at subsequent time t3, END again wraps around. Anytime that END is lower than BEGIN, such as shown at a subsequent time t4, the number of activated DAC elements is determined by a first range from BEGIN to the maximum value N−1 as shown by a dashed arrow 308, plus a second range from zero to END as shown by dashed arrow 306. It is noted that the corresponding signal level as depicted by arrow 310 has a length that is equal to the combined lengths of the arrows 306 and 308. Operation continues in similar manner over time.

In the simplest addressing scheme for a group size of M=1 (and ignoring operation of other adjustment circuitry, such as, for example, the derivative control circuitry 206, the shuffle control circuitry 208, and the spread spectrum control circuitry 212), the BEGIN and END pointers advance only the same amount as the SS signal decreases or increases, respectively. Ignoring noise and offset for the moment, if the signal level begins at zero and only increases, then only the END pointer advances. As END advances, it enables one or more registers which activate one or more of the corresponding DAC elements so that all of the DAC elements between BEGIN and END are activated. When the signal level reaches 50%, then the END pointer is half-way within the output register controlling activation of the DAC elements. When END reaches the maximum value of N−1, then all of the DAC elements are activated. Then when the signal decreases, the BEGIN pointer advances disabling registers while deactivating corresponding DAC elements.

In a more advanced addressing scheme as further described herein, the DAC elements may be divided in consecutive groups of M out of the total number N of DAC elements. In this case, the pointers are advanced in DAC element multiples of M for each pointer step. In addition, rather than activating or deactivating each of the DAC elements in each added or dropped group, only 1 of the M DAC elements in the groups is pseudo-randomly activated or deactivated depending upon the state of the corresponding register. Due to the M grouping, the complexity of the control is still low, while the linearity performance is significantly better.

Figure 4:
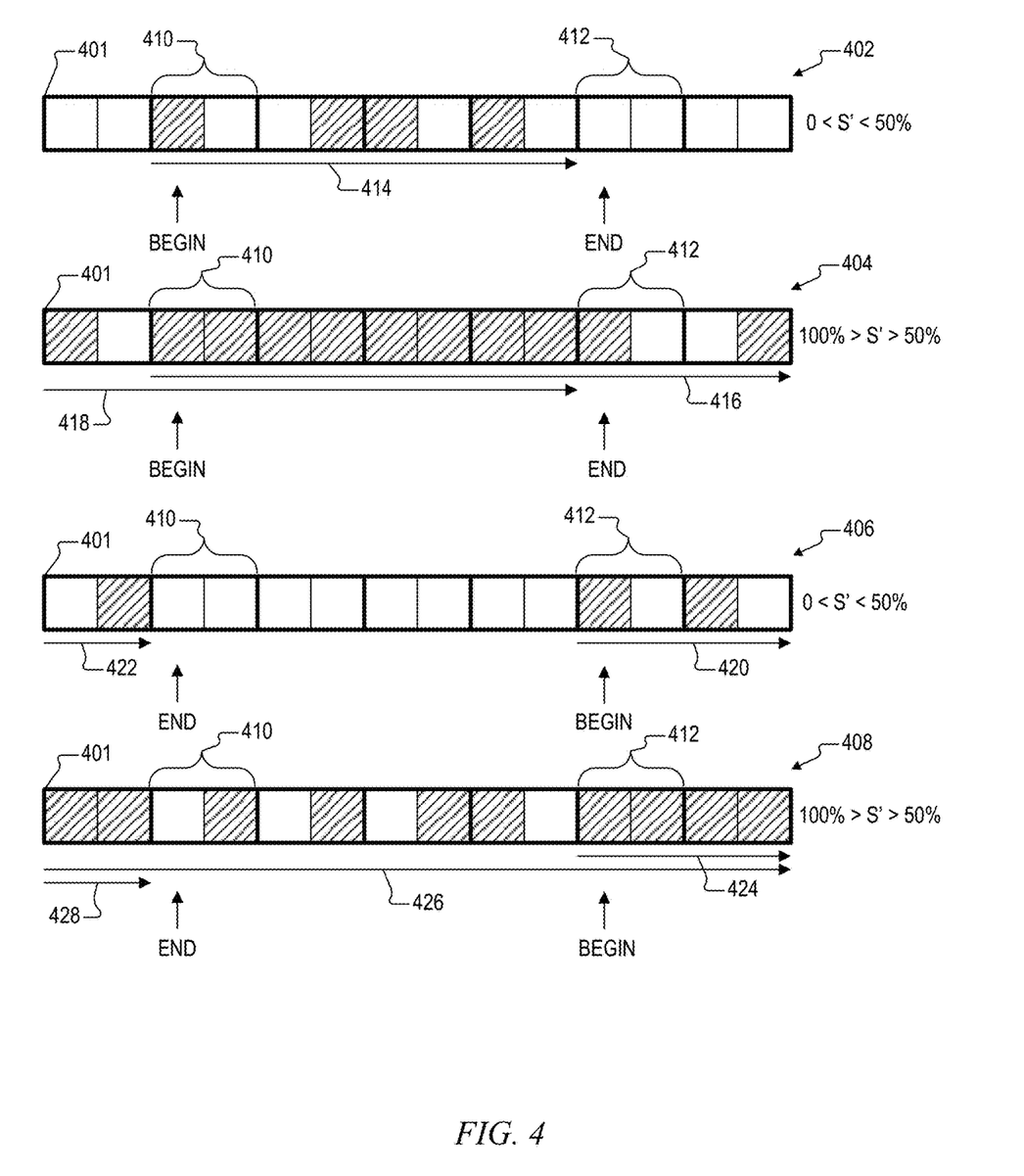
FIG. 4 is a simplified diagram of an exemplary register set with a register group size of M=2 under four different scenarios illustrating enablement of registers within each register group for a signal level of S' relative to the 50% level according to one embodiment.

FIG. 4 is a simplified diagram of an exemplary register set 401 with a group size of M=2 under four different scenarios 402, 404, 406, and 408 illustrating enablement of registers within each register group for a signal level of S' relative to the 50% level according to one embodiment. The exemplary register set only includes 14 registers for purposes of illustration, in which it is understood the principles of element enablement for larger register sets are the same. Each individual block represents an individual register, and the registers are grouped into register groups (2 registers per group for M=2). The state of each register is depicted by block shading, in which an empty block denotes that the register is disabled to deactivate the corresponding DAC element and shaded to denote that the register is enabled to activate the corresponding DAC element (such as shown in FIG. 1). The BEGIN pointer points to a register group 410 and the END pointer points to a register group 412 for the first two scenarios 402 and 404, whereas the BEGIN pointer points to the register group 412 and the END pointer points to the register group 410 for the last two scenarios 406 and 408.

The cases in which signal level S' is at 0%, 50%, or 100% are excluded since BEGIN=END and the relative enablement level and actual location of the pointers depends upon past operation. For example, the pointers BEGIN, and END are equal at 0% while none of the registers are enabled (all register groups at binary state 00b, in which an appended "b" denotes binary notation), the pointers BEGIN and END are equal at 50% while one register of each register group is enabled (all register groups at 01b or 10b), the pointers BEGIN, and END are equal at 100% while all registers are enabled (all register groups at 11b). Pseudo random enabling applies when the END pointer advances to add register groups without any registers enabled for selecting the register to enable. Although not shown in the scenarios, pseudo random disabling applies when the BEGIN pointer advances to remove register groups with both registers enabled for selecting the register to disable.

The first scenario 402 illustrates a signal level of S'=4 of 14 meaning that more than zero but less than 50% of the registers have been pseudo-randomly enabled (and thus only 4 of 14 total DAC elements are activated). The second scenario 404 illustrates a signal level of S'=11 which is greater than 50% but less than 100% meaning that more than 50% of the registers have been enabled. For the first scenario 402, the END pointer has advanced relative to the BEGIN pointer without wrap around as indicated by an arrow 414, so that 0<S'<50%. In this manner, one register of each register group between register group 410 (included) and the register group 412 (excluded) has been pseudo-randomly enabled as shown. In addition, both registers are disabled from register group 412 (included) wrapped around to the beginning and up to the register group 410 (excluded).

Note that the register group 412 is excluded meaning that neither register has yet been enabled in this case. Thus, the END pointer advances one register group ahead. Although not shown, at the start if S'=0 and the pointers are pointing to the same register group 410, and none of the registers are enabled, then when S' is incremented to one, END advances 1 register group and 1 of the registers in register group 410 is pseudo-randomly enabled (such as shown for register group 410). When the END pointer points to register group 412 as shown, 4 registers have been pseudo-randomly enabled. If the END pointer continues to advance wrapping around back to register group 410 such that the pointers END=BEGIN once again, 50% of the registers have been pseudo-randomly enabled including 1 per register group.

For the second scenario 404, the END pointer has advanced relative to the BEGIN pointer with wrap around back to register group 412 as indicated by arrows 416 and 418 so that S'>50%. In this case, both register are enabled for each register group added with the advance of the END pointer past BEGIN. Thus, both registers of the register groups from register group 410 (included) to the register group 412 (excluded). Again, register group 412 is excluded from both registers being enabled since the END pointer is one register group ahead.

The third scenario 406 illustrates a signal level of S'=3 of 14 which is greater than zero and less than 50%, and the fourth scenario 408 illustrates a signal level of S'=10 of 14 which is greater than 50%. Operation is substantially similar to that shown in scenario 402 except including wrap around. For the third scenario 406, the END pointer started from the same register group 412 pointed to by the BEGIN pointer and wrapped around once to the register group 410 as indicated by arrows 420 and 422, so that 0<S'<50%. In this manner, one of the registers of each register group between register group 412 (included) wrapped around to the register group 410 (excluded) is enabled as shown.

When comparing scenarios 402 and 406, if the pointers started from the positions shown in scenario 402 and instead the BEGIN pointer advanced from register group 410 to the register group 412 following arrow 414 (for the starting conditions of the scenario 406), then both pointers BEGIN, and END would be equal and pointing to register group 412 and none of the registers are enabled. In this manner, the enabled register of register group 410 to register group 412 is disabled as the BEGIN pointer advances from register group 410 to register group 412.

For the fourth scenario 408, the END pointer started from the same register group 412 pointed to by the BEGIN pointer and wrapped around twice to the register group 410 as indicated by arrows 424, 426, and 428 so that S'>50%. In this case, after the first wrap around when the END pointer reached the BEGIN pointer so that both pointed to register group 412, 50% of the registers have been pseudo-randomly enabled. As the END pointer advances past the END pointer and wrapped around back to register group 410 as shown, both registers of each added register group are enabled excluding the register group 410 since the END pointer is one step ahead as previously described.

Figure 5:
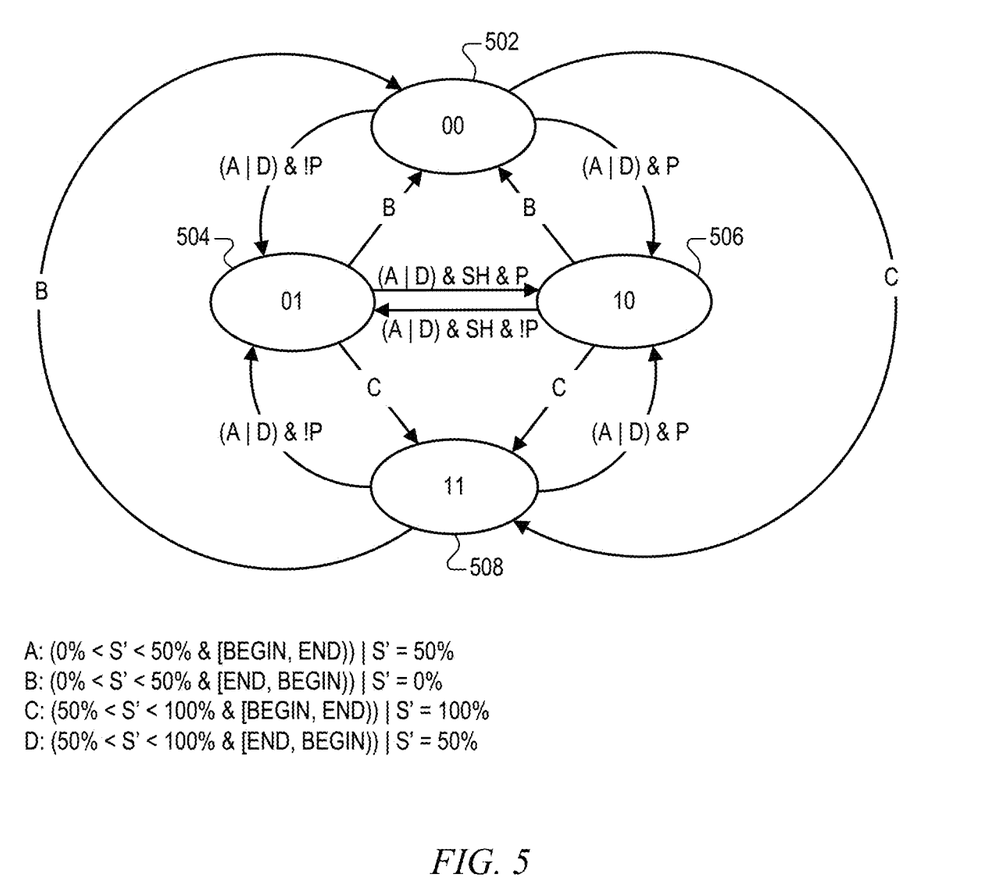
FIG. 5 is a state diagram illustrating operation of each of the decoders of FIG. 2 for a register group size M=2 for determining the state of a corresponding register group according to one embodiment.

FIG. 5 is a state diagram illustrating operation of each of the decoders 214 for a register group size M=2 for determining the state of a corresponding register group according to one embodiment. Each of the decoders 214 has four states based on the binary state of each of a corresponding register group of the output register 216, including a first state 502 with a binary state 00b when both registers are disabled, a second state 504 with binary state 01b when the first register is disabled and the second register is enabled, a third state 506 with binary state 10b when the first register is enabled and the second register is disabled, and a fourth state 508 with binary state 11b when both registers are enabled. The register state of each register group determines the activation state of a pair of DAC elements within the DAC 108 as previously described.

The advancement of each register group from one state to another based on advancement of the BEGIN and END pointers is determined by four binary values A, B, C, and D, a corresponding P value and a corresponding SH value. The binary value A is true when (0%<S'<50% & [BEGIN, END))|S'=50%, the binary value B is true when (0%<S'<50% & [END, BEGIN)) S'=0%, the binary value C is true when (50%<S'<100% & [BEGIN, END)) S'=100%, and the binary value D is true when (50%<S'<100% & [END, BEGIN))|S'=50%, in which "&" denotes Boolean logic "AND", "|" denotes Boolean logic "OR", and [BEGIN, END) or [END, BEGIN) are range conditions depending upon the values of the BEGIN and END pointers and group position, brackets "[ ]" denote set inclusiveness, and parenthesis "( )" denote set exclusiveness. The value "P" is a corresponding one of the N/M (or N/2 when M=2) binary probability values pseudo-randomly generated and provided by the pseudo random generator 210 to the applicable decoder, where "!P" means "not P" or an inverted value of P. The value "SH" is a corresponding one of the Z shuffle control signals SH for controlling a level of shuffling determined by the shuffle control circuitry 208 described further herein. Generally, shuffling involves swapping the binary states of the corresponding register group, such as swapping from 01b to 10b or swapping from 10b to 01b.

A decoder and corresponding register group state advances from state 502 to state 504 when (A|D) & !P is true, and advances from state 504 to state 502 when B is true. The decoder and corresponding register group state advances from state 502 to state 506 when (A|D) & P is true, and advances from state 506 to state 502 when B is true. The decoder and corresponding register group performs shuffling to swap binary register states from state 504 to state 506 when (A|D) & SH & P is true and shuffling to swap binary register states from state 506 to state 504 when (A|D) & SH & !P is true. The decoder and corresponding register group state advances from state 508 to state 504 when (A|D) & !P is true, and advances from state 504 to state 508 when C is true. The decoder and corresponding register group state advances from state 508 to state 506 when (A|D) & P is true, and advances from state 506 to state 508 when C is true. The decoder and corresponding register group state advances from state 508 to state 502 when B is true, and advances from state 502 to state 508 when C is true.

Figure 6:
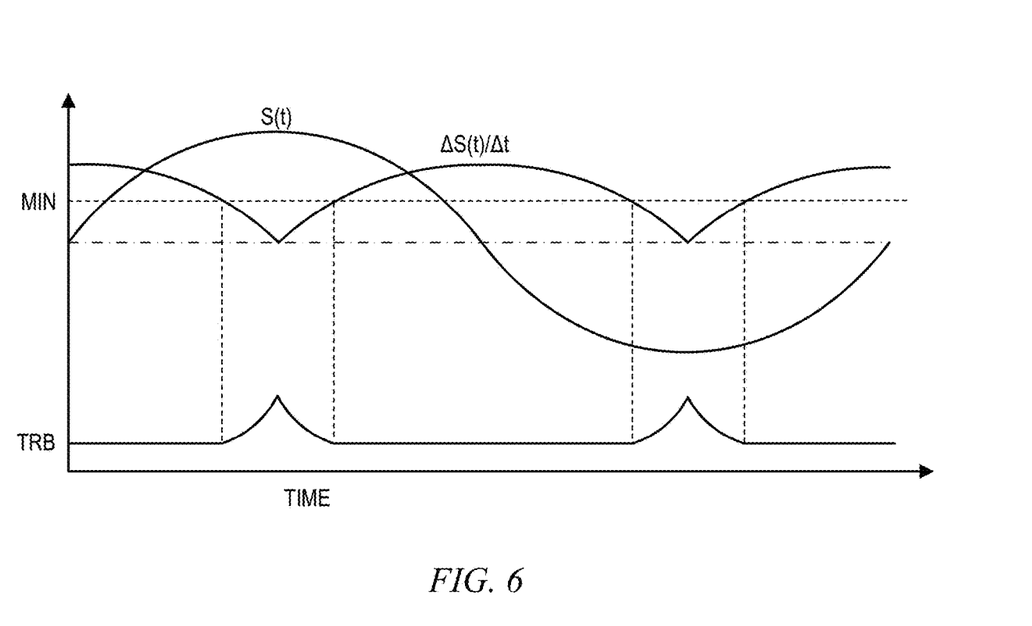
FIG. 6 is a simplified graphic diagram illustrating operation of the derivative control circuitry of FIG. 2 performing a boost technique according to one embodiment.

FIG. 6 is a simplified graphic diagram illustrating operation of the derivative control circuitry 206 performing a boost technique according to one embodiment. A signal S(t) is plotted versus time representing a noiseless version of the sinusoidal S signal. The derivative control circuitry 206 determines the derivative function $\Delta S(t)/\Delta t$ of S(t) which indicates the rate of change of S(t). The function $\Delta S(t)/\Delta t$ is also plotted superimposed with S(t) versus time. The selection rate of the DAC elements is proportional to $\Delta S(t)/\Delta t$, which is the time derivative of S(t). It is desired to keep the selection rate substantially constant or at least above a predetermined minimum, indicated as a dashed line MIN. A higher selection rate more evenly distributes utilization of the DAC elements over time to improve performance. When $\Delta S(t)/\Delta t$ falls below MIN, the selection rate has reduced below a minimum desired level which tends to reduce overall performance.

Also plotted is the transition rate boost signal TRB versus time which is provided at the output of the derivative control circuitry 206. When $\Delta S(t)/\Delta t$ decreases below MIN, TRB increases by a proportional amount as shown reaching a maximum when $\Delta S(t)/\Delta t$ falls to zero. With reference back to FIG. 2, TRB is used by the shuffle control circuitry 208 to derive the boost signal BST1. The pointer control circuitry 204 shifts the pointers by advancing both the BEGIN and END pointers together by the same amount based on the BST1 signal to increase the selection rate above MIN without changing the total number of registers that are enabled. As an example, assume that the shuffle control circuitry 208 does not further adjust TRB so that BST1 directly reflects the magnitude of TRB. In this case, a low value of TRB may result in BEGIN and END advancing 1 additional step per clock cycle, whereas a higher value of TRB may result in BEGIN and END advancing 2 additional steps or more per clock cycle based on the magnitude of TRB. The boost technique is intended to increase the selection rate by shifting the pointers together by a rate based on the magnitude of TRB. The effectiveness of this boost technique, however, may vary based on the signal level as further described below.

Figure 7:
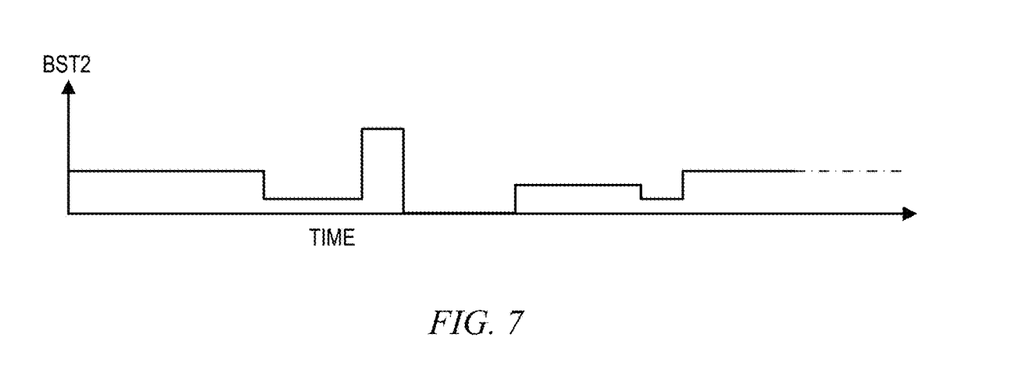
FIG. 7 is a graphic diagram plotting the BST2 signal versus time illustrating operation of the spread spectrum control circuitry of FIG. 2 according to one embodiment.

FIG. 7 is a graphic diagram plotting the BST2 signal versus time illustrating operation of the spread spectrum control circuitry 206 according to one embodiment. The generated tones may be pure sine or cosine waveforms, which are periodic in nature. Consequently, the BEGIN and END pointers may advance and wrap in correspondence with the amplitude and frequency of one or more of the tones which results in a relatively strong correlation between the tone(s) and the selected DAC elements. Such correlation, for example, may cause the pointers to frequent the same locations over time, which reduces overall performance. In order to prevent or otherwise mitigate this undesirable correlation, a spread spectrum technique may be used by the spread spectrum control circuitry 206 to distribute the energy of the systematic spurs randomly over a range of frequencies with a sufficiently large periodicity. The spread spectrum control circuitry 206 uses the pseudo random signal PR2 to perform the spread spectrum technique to generate the BST2 signal as shown.

The particular plot of BST2 is arbitrary and used only as an example. In general, the magnitude of BST2 randomly fluctuates over time based on PR2. The spread-spectrum boost signal BST2 is used by pointer control circuitry 204 to add the same randomly varied values to both BEGIN and END pointers over time. The level or amount of BST2 is kept small and has a level sufficient to reduce or minimize correlation. Similar to the boost technique, the total number of enabled registers is not changed when the same adjustment is applied to both pointers. Randomly varied small adjustments to the pointers, however, tends to compensate for any correlation. In other words, the randomly adjusted small values added to both pointers mitigates any correlation between the input signal and the selected DAC elements.

Figure 8:
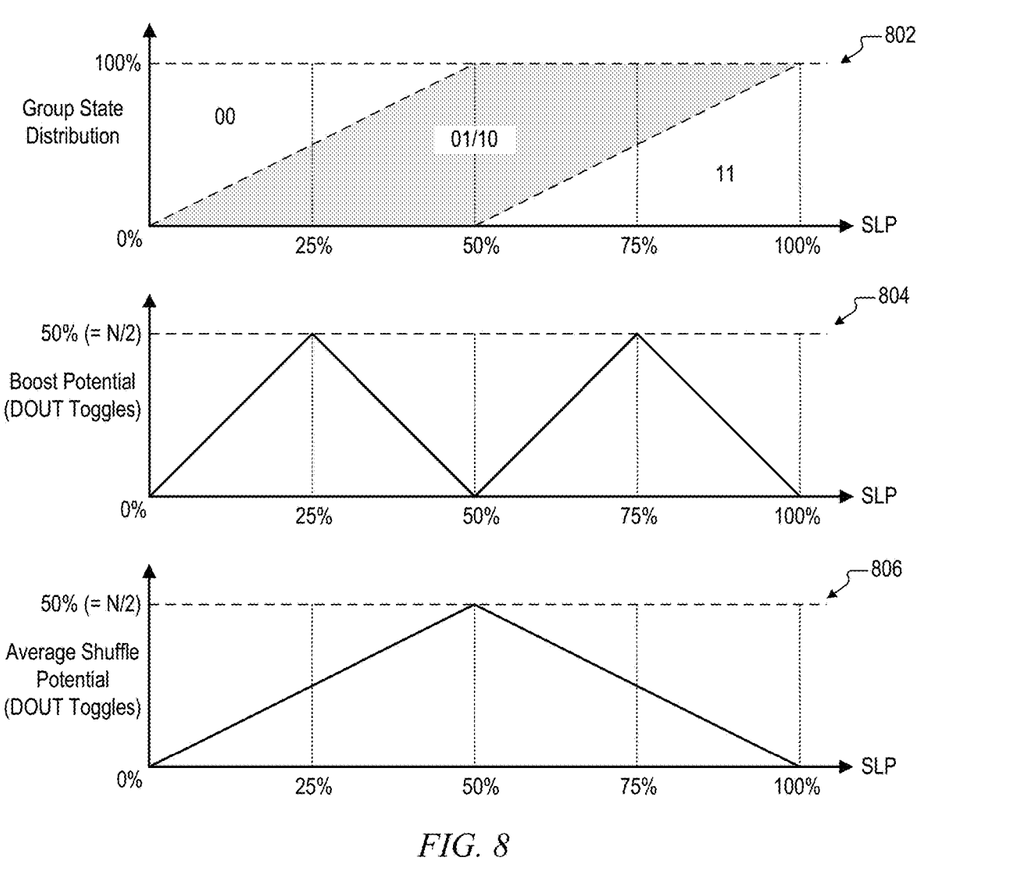
FIG. 8 is a series of graphic diagrams plotting group state distribution, boost potential, and average shuffle potential, each plotted versus a signal level percentage SLP which ranges from 0% to 100% for a register group size of M=2.

FIG. 8 is a series of graphic diagrams plotting group state distribution shown by graph 802, boost potential indicated by a number of toggles of DOUT shown by graph 804, and average shuffle potential again indicated by a number of toggles of DOUT shown by graph 806, each plotted versus a signal level percentage SLP which ranges from 0% to 100% for a register group size of M=2. The effectiveness of the derivative control circuitry 206 relies on the boost technique as previously described which works only if moving the pointers results in a level change for the groups of DAC elements (only in case of level change, the elements are randomly selected). E.g., for a group size of M=2 and at the signal level of 50%, all groups have 1 of 2 elements selected, so that changing both pointers BEGIN and END by same amount does not cause the desired random reselection of DAC elements.

The group state distribution as a function of SLP as shown by graph 802 illustrates the relative percentage of register groups with binary state 00b, 01b or 10b, and 11b. At SLP=0%, all of the register groups have binary state 00b meaning that none of the registers are enabled. As SLP increases above 0%, an increasing percentage of the register groups change binary state to either 01b or 10b. At SLP=50%, all of the register groups have a binary state of either 01b or 10b. As SLP increases above 50%, an increasing percentage of the register groups have a state of 11b. At SLP=100%, all of the register groups have a binary state of 11b.

The boost potential as a function of SLP as shown by graph 804 illustrates that the boost potential varies with SLP between 0% and a maximum boost potential of 50%. The boost potential is 0% for SLP=0% (since none of the registers are enabled regardless of pointer positions), 50% (since equally sliding both pointers does not change any of the values since the decoder state machines only look at the range between the pointers), or 100% (since all of the registers are enabled regardless of pointer positions) and is the maximum of 50% for SLP=25% or 75% and is proportionately effective at the other levels of SLP. In the event that the actual boost potential (or effectiveness) is smaller than the desired boost level based on the magnitude of TRB to achieve a desired performance level, the remaining part may be obtained via shuffling, which is a random selection of the groups with binary states 01b or 10b.

The average shuffle potential as a function of SLP as shown by graph 806 illustrates that shuffling is not effective with SLP at 0% or 100%. Nonetheless, the average shuffle potential linearly increases from 0% to 50% as SLP varies from 0% to 50%, and then linearly decreases from 50% back to 0% as SLP varies from 50% to 100%. Since shuffling is enabled based on a statistical parameter as described further herein, the shuffle potential is averaged over time.

A review of graphs 804 and 806 illustrate if TRB is high indicating a need to increase the selection rate such as by application of the boost technique, but the boost potential is low, such as at or near a signal level of 50% as indicated by SLP, then simply shifting the pointers may be an ineffective method, by itself, to increase the selection rate. The shuffle control circuitry 208 may throttle the BST1 signal based on the potential effectiveness of pointer shifting. The shuffle control circuitry 208 may also adjust an amount of shuffling by adjusting the shuffle control signals SH to increase the selection rate to compensate for ineffectiveness of pointer shifting.

In one embodiment, the shuffle control circuitry 208 monitors TRB to identify whether there is a need to increase the selection rate and by how much. The shuffle control circuitry 208 also monitors the S' signal level for determining the relative effectiveness of both shifting and shuffling. Based on a measure of whether the current selection rate is sufficient as indicated by TRB, the shuffle control circuitry 208 determines whether to throttle (e.g., reduce) BST1 to reduce pointer shifting when boost potential is low, and generates or adjusts a shuffle factor for decreasing or increasing an average amount of shuffling over time to achieve a desired selection rate based on the level of S' and the level of TRB.

Figure 9:
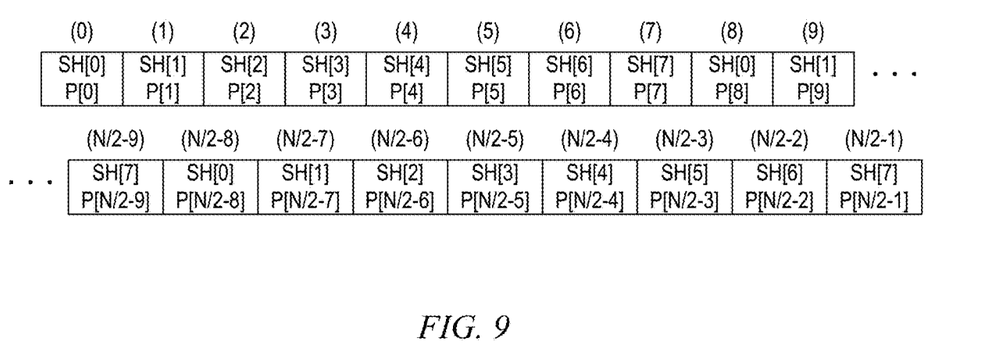
FIG. 9 is a diagram illustrating distribution of the Z=8 shuffle control signals SH[0], SH[1], . . . , SH[7] and the N/2 probability values P[0], P[1], . . . , P[N/2−1] to the decoders of FIG. 2 according to one embodiment.

FIG. 9 is a diagram illustrating distribution of the Z=8 shuffle control signals SH[0], SH[1], . . . , SH[7] and the N/2 probability values P[0], P[1], . . . , P[N/2−1] to the decoders 214 according to one embodiment. Parenthetical numeric values (0), (1), . . . , (N/2−1) each denote a corresponding one of the N/2 decoders 214. Below each decoder number is a block including a corresponding one of the P values and a corresponding one of the SH values. As previously described, the P probability values are the randomly determined binary values, in which each P value is distributed to a corresponding one of the N/2 decoders 214. Thus, P[0] is the P value provided to the first decoder (0), P[1] is the P value provided to the second decoder (1), and so on up to the last P value P[N/2−1], which is provided to the last decoder (N/2−1). The SH values are also binary values, except that the 8 SH values are distributed among the N/2 decoders in which N/2>8. In the illustrated embodiment, SH[0] is the first SH value provided to the first decoder (0), SH[1] is the second SH value provided to the second decoder (1), and so on up to the $8^{th}$ and last SH value SH[7], which is provided to the $8^{th}$ decoder (7). Then the pattern of 8 SH values is repeated for the next set of 8 decoders (8)-(15), and so on up to the last set of 8 decoders numbered (N/2−8) to (N/2−1), which receive the SH values SH[0] to SH[7], respectively. The Z shift values may be considered as a mask that is sequentially repeated across the entire register set.

As previously described, the shift control circuitry 208 generates or adjusts a shuffle factor for decreasing or increasing an average amount of shuffling over time to achieve a desired selection rate based on the levels of S' and TRB. The shuffle factor is a pseudo-randomly determined probability factor applied to each of the shuffle values SH[0]–SH[Z−1] that determines the probability that the shuffle value is a binary "1". For example, if the shuffle factor is 0.25, then there is a 25% chance that each shuffle value is a binary "1", and otherwise it is a binary "0". For Z=8 for 8 shuffle values S[0]–S[7] with a shuffle factor of 0.25, then on average about 2 of the 8 shuffle values are binary "1" values. Similarly, for Z=8 for 8 shuffle values S[0]–S[7] with a shuffle factor of 0.5 (50%), then on average about 4 of the 8 shuffle values are binary "1" values. Since the shuffle factor is applied to each shuffle value independently, the binary "1" values, if any, are randomly distributed among the Z shuffle values. In any given cycle, of course, it is possible (whether probable or not), that all of the shuffle values are binary "1" values or all of the shuffle values are binary "0" values regardless of the shuffle factor. The shuffle factor simply determines the average probability of each shuffle value.

Operation of shuffling is illustrated in the state diagram of FIG. 5. Based on the relative location of a given one of the decoders 214 relative to the BEGIN and END pointers, based on the signal level S', and based on the values of the corresponding shuffle and probability values SH and P, the decoder state may change from 01b to 10b or vice-versa.

The illustrated embodiments have mostly been depicted for a register group size M=2. The register group size may be increased so long as N is equally divisible by the group size of M. It is noted that if the register group size is increased above M=2 for a given number of output registers, the number of decoders is decreased although the complexity of each decoder is increased. For a group size of M=3, for example, the number of states of each register group increases from $2^{M=2}=4$ to $2^{M=3}=8$ (corresponding to binary states 000b, 001b, 010b, . . . , 111b). The signal level measured relative to 50% is based on ½ signal level for M=2, which is changed to ⅓ of the signal level for M=3. Thus, assuming only an increasing input signal S, the END pointer completes a first pass of the register set when the signal level reaches ⅓ level, completes a second pass of the register set when the signal level reaches ⅔ level, and completes a third pass of the register set when the signal reaches ³⁄₃ or full level. The complexity of the P value also increases for pseudo-randomly selecting and enabling 1 of the 3 registers in the first pass, and pseudo-randomly selecting and enabling a second register in the second pass. When the signal level rises above the ⅔ level, the decoders begin enabling all 3 of added register groups. Shuffling is also more complex since shuffling may be applied to each of the states other than 000b and 111b.

Figure 11:
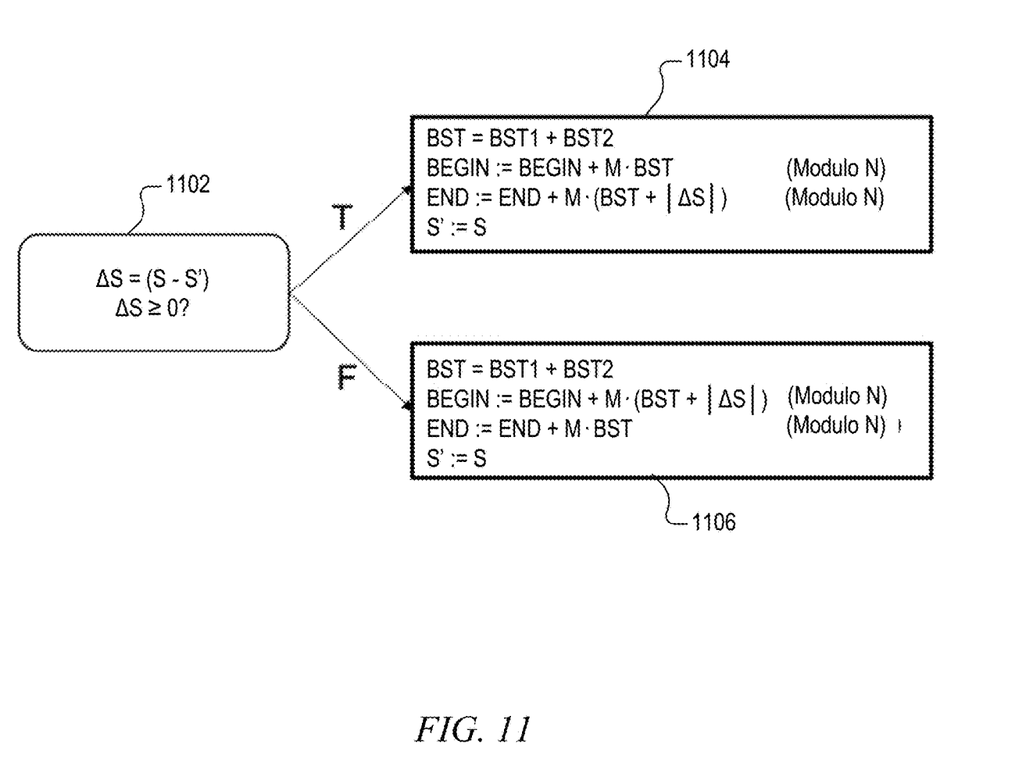
FIG. 11 is a simplified block diagram illustrating pointer control of the BEGIN and END pointers for each clock cycle according to one embodiment.

FIG. 11 is a simplified block diagram illustrating pointer control of the BEGIN and END pointers for each clock cycle according to one embodiment. At first block 1102, a condition is determined based on ΔS, which is defined as the difference between S' and S, or ΔS=S−S'. It is queried at block 1102 whether ΔS≥0 for determining whether the input signal is increasing or decreasing. If so, the conditions of block 1104 for determining BEGIN, END and S' are used. If false, the conditions of block 1106 for determining BEGIN, END and S' are used. In each case, a value BST is set equal to the sum of BST1 and BST2, or BST=BST1+BST2. M is the register group size. The symbol ":=" means an assignment to be effective in the next clock cycle, a dot symbol "·" denotes multiplication, and "|ΔS|" denotes absolute value of ΔS. At block 1104 (for increasing signals), BEGIN:=BEGIN+M·BST, END:=END+M (BST+|ΔS|), and S':=S. At block 1106 (for decreasing signals), END: =END+M·BST, BEGIN:=BEGIN+M (BST+|ΔS|), and S':=S. The determination of BEGIN and END in each case is qualified by wrap around as indicated by Modulo N.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A dynamic element matching system, comprising:
   a plurality of sequential register groups in which each register group comprises at least two registers;
   decode circuitry that controls a state of each of the plurality of register groups based on a level of a digital input signal, a relative position with respect to a begin pointer and an end pointer, and a corresponding one of a plurality of pseudo random probability values;
   pointer control circuitry that cyclically advances the end pointer among the plurality of register groups to add one or more register groups and cause the decode circuitry to enable a register within each added register group in response to the level of the digital input signal increasing, and that cyclically advances the begin pointer among the plurality of register groups to remove one or more register groups and cause the decode circuitry to disable a register within each removed register group in response to the level of the digital input signal decreasing; and
   derivative control circuitry that generates a derivative signal indicative of a rate of change of the level of the digital input signal, and that generates a transition rate boost signal based on how much the derivative signal is below a predetermined minimum rate of change.

2. The dynamic element matching system of claim 1, wherein the decode circuitry pseudo-randomly determines which register is enabled for each added register group having at least two disabled registers, and wherein the decode circuitry pseudo-randomly determines which register is disabled for each removed register group having at least two enabled registers.

3. The dynamic element matching system of claim 1, wherein the pointer control circuitry advances both the begin pointer and the end pointer by an amount proportional to the transition rate boost signal.

4. The dynamic element matching system of claim 1, further comprising:
   shuffle control circuitry that throttles the transition rate boost signal based on the level of the digital input signal to provide a boost signal; and
   wherein the pointer control circuitry advances both the begin pointer and the end pointer by an amount proportional to the boost signal.

5. The dynamic element matching system of claim 1, further comprising:
   shuffle control circuitry that uses the transition rate boost signal and the level of the digital input signal for determining a shuffle factor and that uses the shuffle factor to provide at least one shuffle value indicative of an amount of shuffling to apply; and
   wherein the decode circuitry uses the at least one shuffle value to pseudo-randomly shuffle enablement of registers in each register group having at least one and less than all registers enabled.

6. The dynamic element matching system of claim 1, further comprising:
   shuffle control circuitry that determines a shuffle factor and that uses the shuffle factor to pseudo-randomly determine a plurality of shuffle values that are provided to the decode circuitry and distributed among the plurality of register groups; and
   wherein the decode circuitry uses the plurality of shuffle values to shuffle enablement of registers in each register group having at least one and less than all registers enabled.

7. A dynamic element matching system, comprising:
   a plurality of sequential register groups in which each register group comprises at least two registers;
   decode circuitry that controls a state of each of the plurality of register groups based on a level of a digital input signal, a relative position with respect to a begin pointer and an end pointer, and a corresponding one of a plurality of pseudo random probability values;

pointer control circuitry that cyclically advances the end pointer among the plurality of register groups to add one or more register groups and cause the decode circuitry to enable a register within each added register group in response to the level of the digital input signal increasing, and that cyclically advances the begin pointer among the plurality of register groups to remove one or more register groups and cause the decode circuitry to disable a register within each removed register group in response to the level of the digital input signal decreasing; and spread spectrum control circuitry that generates a boost signal having a value that is pseudo-randomly adjusted over time, wherein the pointer control circuitry advances both the begin pointer and the end pointer by an amount proportional to the boost signal.

8. A method of dynamic element matching, comprising:

controlling a state of each of the plurality of register groups based on a level of a digital input signal, a relative position with respect to a begin pointer and an end pointer, and a corresponding one of a plurality of pseudo random probability values, wherein each of the plurality of register groups comprises at least two registers;

cyclically advancing the end pointer among the plurality of register groups to add one or more register groups and enabling a register within each added register group in response to the level of the digital input signal increasing;

cyclically advancing the begin pointer among the plurality of register groups to remove one or more register groups and disabling a register within each removed register group in response to the level of the digital input signal decreasing;

generating a derivative signal indicative of a rate of change of the level of the digital input signal;

generating a transition rate boost signal based on an amount the derivative signal is below a predetermined minimum rate of change; and advancing both the begin pointer and the end pointer by an additional amount proportional to the transition rate boost signal.

9. The method of claim 8, further comprising:

pseudo-randomly determining which register is enabled for each added register group having at least two disabled registers; and pseudo-randomly determining which register is disabled for each removed register group having at least two enabled registers.

10. The method of claim 8, further comprising:

throttling the transition rate boost signal based on the level of the digital input signal.

11. A method of dynamic element matching, comprising:

controlling a state of each of the plurality of register groups based on a level of a digital input signal, a relative position with respect to a begin pointer and an end pointer, and a corresponding one of a plurality of pseudo random probability values, wherein each of the plurality of register groups comprises at least two registers;

cyclically advancing the end pointer among the plurality of register groups to add one or more register groups and enabling a register within each added register group in response to the level of the digital input signal increasing;

cyclically advancing the begin pointer among the plurality of register groups to remove one or more register groups and disabling a register within each removed register group in response to the level of the digital input signal decreasing;

generating a spread spectrum control boost signal having a value that is pseudo-randomly adjusted over time; and advancing both the begin pointer and the end pointer by an additional amount proportional to the spread spectrum control boost signal.

12. A digital to analog conversion system, comprising:

a digital to analog converter comprising a plurality of unitary conversion elements each activated by a corresponding one of a plurality of input bits; and dynamic element matching circuitry, comprising:

a plurality of sequential register groups in which each register group comprises at least two registers and in which each register provides a corresponding one of the plurality of input bits to the digital to analog converter;

decode circuitry that controls a state of each of the plurality of register groups based on a level of a digital input signal, a relative position with respect to a begin pointer and an end pointer, and a corresponding one of a plurality of pseudo random probability values;

pointer control circuitry that cyclically advances the end pointer among the plurality of register groups to add one or more register groups and cause the decode circuitry to enable a register within each added register group in response to the level of the digital input signal increasing, and that cyclically advances the begin pointer among the plurality of register groups to remove one or more register groups and cause the decode circuitry to disable a register within each removed register group in response to the level of the digital input signal decreasing; and derivative control circuitry that generates a derivative signal indicative of a rate of change of the level of the digital input signal, and that generates a transition rate boost signal based on an amount the derivative signal is below a predetermined minimum rate of change.

13. The digital to analog conversion system of claim 12, wherein the decode circuitry pseudo-randomly determines which register is enabled for each added register group having at least two disabled registers, and wherein the decode circuitry pseudo-randomly determines which register is disabled for each removed register group having at least two enable registers.

14. The digital to analog conversion system of claim 12, wherein the pointer control circuitry advances both the begin pointer and the end pointer by an amount proportional to the transition rate boost signal.

15. The digital to analog conversion system of claim 12, wherein the dynamic element matching circuitry further comprises:

shuffle control circuitry that throttles the transition rate boost signal based on the level of the digital input signal to provide a boost signal; and wherein the pointer control circuitry advances both the begin pointer and the end pointer by an amount proportional to the boost signal.

16. The digital to analog conversion system of claim 12, wherein the dynamic element matching circuitry further comprises:

shuffle control circuitry that determines a shuffle factor and that uses the shuffle factor to pseudo-randomly determine a plurality of shuffle values that are provided to the decode circuitry and distributed among the plurality of register groups; and wherein the decode circuitry uses the plurality of shuffle values to shuffle enablement of registers in each register group having at least one and less than all registers enabled.

17. A digital to analog conversion system, comprising:

a digital to analog converter comprising a plurality of unitary conversion elements each activated by a corresponding one of a plurality of input bits; and dynamic element matching circuitry, comprising:

a plurality of sequential register groups in which each register group comprises at least two registers and in which each register provides a corresponding one of the plurality of input bits to the digital to analog converter;

decode circuitry that controls a state of each of the plurality of register groups based on a level of a digital input signal, a relative position with respect to a begin pointer and an end pointer, and a corresponding one of a plurality of pseudo random probability values;

pointer control circuitry that cyclically advances the end pointer among the plurality of register groups to add one or more register groups and cause the decode circuitry to enable a register within each added register group in response to the level of the digital input signal increasing, and that cyclically advances the begin pointer among the plurality of register groups to remove one or more register groups and cause the decode circuitry to disable a register within each removed register group in response to the level of the digital input signal decreasing; and spread spectrum control circuitry that generates a boost signal having a value that is pseudo-randomly adjusted over time, wherein the pointer control circuitry advances both the begin pointer and the end pointer by an amount proportional to the boost signal.

* * * * *